(12) United States Patent
Harumoto et al.

(10) Patent No.: US 10,832,925 B2
(45) Date of Patent: Nov. 10, 2020

(54) THERMAL PROCESSING DEVICE, SUBSTRATE PROCESSING APPARATUS, THERMAL PROCESSING METHOD AND SUBSTRATE PROCESSING METHOD

(71) Applicant: SCREEN HOLDINGS CO., LTD., Kyoto (JP)

(72) Inventors: Masahiko Harumoto, Kyoto (JP); Masaya Asai, Kyoto (JP); Yuji Tanaka, Kyoto (JP); Koji Kaneyama, Kyoto (JP)

(73) Assignee: SCREEN Holdings Co., Ltd. (JP)

( * ) Notice: Subject to any disclaimer, the term of this patent is extended or adjusted under 35 U.S.C. 154(b) by 351 days.

(21) Appl. No.: 15/669,202

(22) Filed: Aug. 4, 2017

(65) Prior Publication Data
US 2018/0050368 A1 Feb. 22, 2018

(30) Foreign Application Priority Data
Aug. 18, 2016 (JP) .................. 2016-160561

(51) Int. Cl.
*H01L 21/67* (2006.01)
*H01L 21/687* (2006.01)
(Continued)

(52) U.S. Cl.
CPC .......... *H01L 21/67098* (2013.01); *B05D 1/60* (2013.01); *B05D 3/007* (2013.01);
(Continued)

(58) Field of Classification Search
CPC ....... C23C 14/00; C23C 16/00; G03F 7/0002; G03F 7/20; H01L 21/67103; H01L 21/0273; H01L 21/68742; H01L 21/02318; H01L 21/02282; H01L 21/02118; H01L 21/67248; H01L 21/67098;
(Continued)

(56) References Cited

U.S. PATENT DOCUMENTS

2003/0166305 A1* 9/2003 Shinya ............. H01L 21/67098
438/7
2006/0289431 A1 12/2006 Hayasaki et al. ............ 219/390
(Continued)

FOREIGN PATENT DOCUMENTS

JP 2011-515537 A 5/2011
JP 2013-232621 A 11/2013
(Continued)

OTHER PUBLICATIONS

Office Action dated May 19, 2020 in counterpart Japanese Patent Application No. 2016-160561 English translation in Global.

*Primary Examiner* — Laura Edwards
(74) *Attorney, Agent, or Firm* — Ostrolenk Faber LLP (57) ABSTRACT

A heating plate is stored in a chamber. With a solvent containing gas present in the chamber, a substrate on which a DSA film is formed is held at a position further upward than the heating plate. Thus, neutralization of an atmosphere is performed at a temperature at which microphase separation does not occur. Thereafter, with the solvent containing gas present in the chamber, the substrate is held on an upper surface of the heating plate. Thus, thermal processing is performed on the DSA film on the substrate.

8 Claims, 9 Drawing Sheets

(51) Int. Cl.
*H01L 21/027* (2006.01)
*G03F 7/00* (2006.01)
*H01L 21/02* (2006.01)
*B05D 1/00* (2006.01)
*B05D 3/00* (2006.01)

(52) U.S. Cl.
CPC ........ *G03F 7/0002* (2013.01); *H01L 21/0273* (2013.01); *H01L 21/67103* (2013.01); *H01L 21/68742* (2013.01); *H01L 21/02118* (2013.01); *H01L 21/02282* (2013.01); *H01L 21/02318* (2013.01)

(58) Field of Classification Search
CPC ..... H01L 21/67017; B05C 11/08; B05C 9/14; B05C 13/00
USPC .......................................................... 118/58
See application file for complete search history.

(56) References Cited

U.S. PATENT DOCUMENTS

| | | | |
|---|---|---|---|
| 2008/0217293 A1* | 9/2008 | Iimuro | H01L 21/67173 216/57 |
| 2009/0236309 A1 | 9/2009 | Millward et al. | 216/39 |
| 2012/0223053 A1 | 9/2012 | Millward et al. | 216/55 |
| 2014/0022521 A1 | 1/2014 | Harumoto et al. | 355/27 |
| 2014/0107296 A1 | 4/2014 | Millward et al. | 525/280 |
| 2014/0273472 A1 | 9/2014 | Somervell et al. | 438/702 |
| 2015/0062545 A1 | 3/2015 | Muramatsu et al. | 355/30 |
| 2016/0163560 A1 | 6/2016 | Esaki et al. | |
| 2016/0218032 A1 | 7/2016 | Millward et al. | |
| 2016/0289839 A1 | 10/2016 | Harumoto et al. | |
| 2018/0044795 A1 | 2/2018 | Harumoto et al. | |
| 2019/0115252 A1 | 4/2019 | Millward et al. | |

FOREIGN PATENT DOCUMENTS

| | | |
|---|---|---|
| JP | 2014-022570 A | 2/2014 |
| JP | 2014-157929 A | 8/2014 |
| JP | 2014-187103 A | 10/2014 |
| JP | 2016-515309 A | 5/2016 |
| JP | 5918122 B2 | 5/2016 |
| JP | 2016-111115 A | 6/2016 |
| KR | 10-2010-0128334 A | 12/2010 |
| KR | 10-2014-0011262 A | 1/2014 |
| TW | 200644052 A | 12/2006 |

* cited by examiner

THERMAL PROCESSING DEVICE, SUBSTRATE PROCESSING APPARATUS, THERMAL PROCESSING METHOD AND SUBSTRATE PROCESSING METHOD

BACKGROUND OF THE INVENTION

Field of the Invention

The present invention relates to a thermal processing device that performs thermal processing on a substrate, a substrate processing apparatus including the thermal processing device, a thermal processing method for performing thermal processing on the substrate, and a substrate processing method including the thermal processing method.

Description of Related Art

Substrate processing apparatuses are used to subject substrates such as semiconductor substrates, substrates for liquid crystal display devices, substrates for plasma displays, substrates for optical discs, substrates for magnetic discs, substrates for magneto-optical discs, substrates for photomasks and other substrates to various types of processing.

In recent years, a DSA (Directed Self Assembly) technique using microphase separation of a block copolymer has been suggested in order to realize an even finer pattern on a substrate.

In a pattern forming method described in JP 5918122 B2, for example, a film of a Polystyrene-Polymethyl Methacrylate block copolymer is formed on the substrate, and the film of the block copolymer is heated. The heated film of the block copolymer is irradiated with ultraviolet light from an Xe excimer lamp under an atmosphere of an inert gas, and an organic solvent is supplied to the film of the block copolymer irradiated with the ultraviolet light.

In a substrate processing method described in JP 2014-22570 A, an underlayer is formed to cover an upper surface of a substrate, and a guide pattern is formed on the underlayer. A DSA film constituted by two types of polymers is formed in a region on the underlayer on which the guide pattern is not formed. Solvent thermal processing is performed on the DSA film on the substrate, whereby microphase separation of the DSA film occurs. Thereafter, exposure processing and development processing are performed in this order, and thus a pattern is formed.

BRIEF SUMMARY OF THE INVENTION

As a result of various experiments, the inventors of the present application found that the microphase separation of a DSA material is sometimes not performed appropriately by pattern forming methods using the above-mentioned conventional DSA technique. In that case, a desired pattern cannot be acquired.

An object of the present invention is to provide a thermal processing device in which appropriate microphase separation of a Directed Self Assembly material can occur, a substrate processing apparatus including the thermal processing device, a thermal processing method by which the appropriate microphase separation of the Directed Self Assembly material can occur, and a substrate processing method including the thermal processing method.

(1) A thermal processing device according to one aspect of the present invention that performs thermal processing on a substrate on which a process film made of a Directed Self Assembly material is formed includes a heater that performs the thermal processing on the substrate at a preset thermal processing temperature, a chamber that stores the heater, a gas supplier that supplies a solvent containing gas including an organic solvent into the chamber, a substrate mover that moves the substrate between a first position at which the thermal processing is not performed on the substrate by the heater and a second position at which the thermal processing is performed on the substrate by the heater in the chamber, and a moving controller that controls the substrate mover such that the substrate is held at the first position with the solvent containing gas supplied by the gas supplier present in the chamber, and then controls the substrate mover such that the substrate is held at the second position with the solvent containing gas present in the chamber.

In this thermal processing device, with the solvent containing gas present in the chamber, the substrate is held at the first position, and the thermal processing is not performed. Thus, the process film on the substrate comes into contact with the solvent containing gas. The affinities of the organic solvent for a plurality of polymers that constitute the Directed Self Assembly material are close to one another. That is, an atmosphere that comes into contact with the process film is neutralized. Thereafter, the thermal processing is performed on the substrate at the second position. Thus, microphase separation occurs in the process film. In this case, because the atmosphere that is in contact with the process film is neutralized before the thermal processing, only one of polymers that constitute the Directed Self Assembly material is prevented from forming a layer which is in contact with the atmosphere. As a result, the appropriate microphase separation of the Directed Self Assembly material can occur.

(2) The heater may include a heating plate having a heating surface, the first position may be a position further upward than the heating surface of the heating plate, and the second position may be a position in the proximity of the heating surface such that the thermal processing is performed by the heating plate, and the substrate mover may include a supporter that moves the substrate between the position further upward than the heating surface and the position in the proximity of the heating surface in the chamber while supporting the substrate.

In this case, it is possible to neutralize the atmosphere and perform the thermal processing for the substrate with a simple configuration by moving the substrate in an up-and-down direction.

(3) A temperature of the substrate in the case where the substrate is located at the first position may be a temperature at which microphase separation does not occur in the process film. In this case, an occurrence of the microphase separation in the process film during the neutralization of the atmosphere is prevented.

(4) The thermal processing device may further include a discharger that reduces pressure in the chamber by discharging air from the chamber with the substrate held at the first position by the substrate mover, wherein the gas supplier may supply the solvent containing gas into the chamber in which the pressure is reduced by the discharger.

In this case, air can be efficiently replaced with the solvent containing gas. Thus, a defect is unlikely to occur in a pattern formed by the microphase separation.

(5) The thermal processing device may further include a solvent concentration detector that detects a solvent concentration in the chamber, wherein the discharger and the gas supplier may discharge air from the chamber and supply the solvent containing gas into the chamber such that the solvent concentration detected by the solvent concentration detector is equal to or higher than a preset allowable value.

In this case, because the solvent concentration in the solvent containing gas is equal to or higher than the allowable value, an occurrence of a defect in the pattern formed by the microphase separation is prevented.

(6) The movement controller may control the substrate mover such that, after the thermal processing is performed on the substrate by the heater, the substrate is held at the first position until a temperature of the substrate is reduced to a temperature at which microphase separation of the process film does not occur, and the thermal processing device may further include a replacer that, after the substrate mover holds the substrate on which the thermal processing has been performed, replaces the solvent containing gas with air.

In this case, the microphase separation does not occur in the process film on the substrate when the solvent containing gas in the chamber is replaced with air. Therefore, an occurrence of the microphase separation in air is prevented.

(7) The solvent containing gas may include an inert gas.

(8) A substrate processing apparatus according to another aspect of the present invention includes a coater that forms a process film on the substrate by applying a Directed Self Assembly material to the substrate, and the above-mentioned thermal processing device that performs thermal processing on the process film formed on the substrate by the coater.

In this substrate processing apparatus, the process film made of the Directed Self Assembly material can be formed on the substrate, and the appropriate microphase separation of the Directed Self Assembly material can occur in the process film.

(9) The substrate processing apparatus further includes an exposer that performs exposure processing on the process film on which the thermal processing has been performed by the thermal processing device, and a developer that performs development processing on the process film on which the exposure processing has been performed by the exposer.

In this case, a pattern can be formed on the process film in which the appropriate microphase separation of the Self Directed Assembly material has occurred.

(10) A thermal processing method according to yet another aspect of the present invention for performing thermal processing on a substrate on which a process film made of a Directed Self Assembly material is formed, includes the steps of holding the substrate at a first position at which the thermal processing is not performed by a heater with an organic solvent containing gas including an organic solvent present in a chamber that stores the heater, and holding the substrate at the first position and then holding the substrate at a second position at which the heating processing is performed by the heater in the chamber.

In this thermal processing method, because the atmosphere that is in contact with the process film is neutralized, only one of polymers that constitute the Directed Self Assembly material is prevented from forming a layer which is in contact with the atmosphere. As a result, the appropriate microphase separation of the Directed Self Assembly material can occur.

(11) A substrate processing method according to yet another aspect of the present invention includes the steps of forming a process film made of a Directed Self Assembly material on a substrate in a coater, and performing thermal processing on the substrate on which the process film is formed by the above-mentioned thermal processing method.

In the substrate processing method, the process film made of the Directed Self Assembly material can be formed on the substrate, and the appropriate microphase separation of the Directed Self Assembly material can occur in the process film.

Other features, elements, characteristics, and advantages of the present invention will become more apparent from the following description of preferred embodiments of the present invention with reference to the attached drawings.

DESCRIPTION OF THE PREFERRED EMBODIMENTS

A thermal processing device and a substrate processing apparatus including the thermal processing device, and a thermal processing method and a substrate processing method including the thermal processing method, according to an embodiment of the present invention, will be described below with reference to drawings. In the following description, a substrate refers to a semiconductor substrate, a substrate for a liquid crystal display device, a substrate for a plasma display, a glass substrate for a photomask, a substrate for an optical disc, a substrate for a magnetic disc, a substrate for a magneto-optical disc, a substrate for a photomask and the like.

(1) Thermal Processing Device

Figure 1:
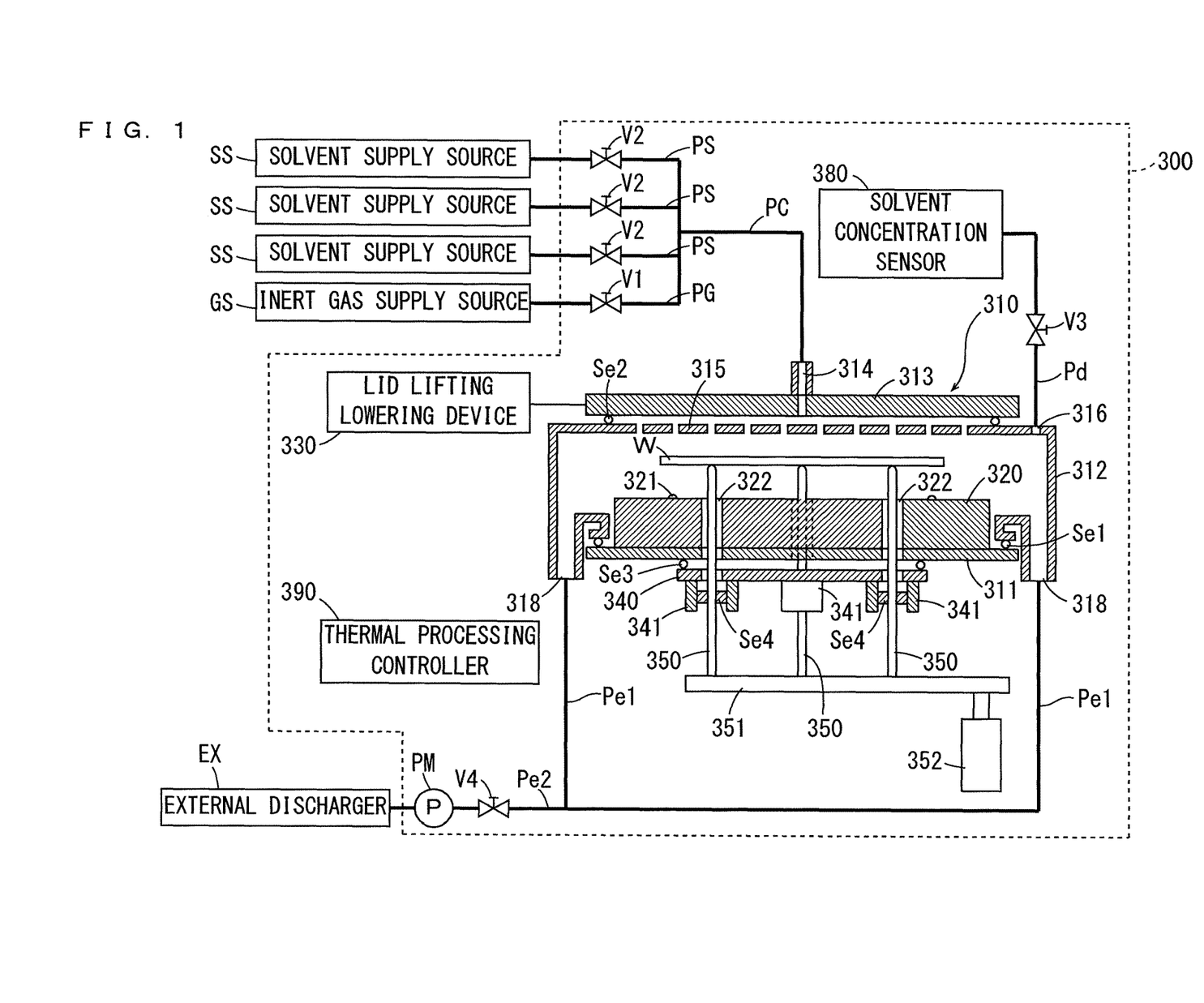
FIG. 1 is a schematic cross sectional view showing a configuration of a thermal processing device according to one embodiment of the present invention.

FIG. 1 is a schematic cross sectional view showing the configuration of the thermal processing device according to one embodiment of the present invention. As shown in FIG. 1, the thermal processing device 300 includes a chamber 310. The chamber 310 is constituted by a bottom plate 311, a peripheral wall 312 and a lid 313. The bottom plate 311 is provided to close a lower opening of the peripheral wall 312. A gap between the bottom plate 311 and the peripheral wall 312 is sealed by a seal member Se1. On the inner side of the peripheral wall 312, a heating plate 320 is provided on the bottom plate 311. A heating generator (a heater) is provided in the heating plate 320.

A supply port 314 is formed in a center portion of the lid 313. A diffusion plate 315 having a plurality of holes is attached under the lid 313. The lid 313 is provided to close an upper opening of the peripheral wall 312. A gap between the lid 313 and the peripheral wall 312 is sealed by a seal member Se2.

The lid 313 is connected to a lid lifting lowering device 330. The lid 313 is lifted and lowered between an upper position and a lower position by the lid lifting lowering device 330. In the case where the lid 313 is located at the upper position, the upper opening of the peripheral wall 312 is open. In the case where the lid 313 is located at the lower position, the upper opening of the peripheral wall 312 is closed. In this case, a lower surface of the lid 313 adheres to the seal member Se2, and a hermetic processing space is formed inside of the chamber 310.

A plurality (three, for example) of proximity balls 321 are provided at an upper surface of the heating plate 320. The upper surface of the heating plate 320 is a heating surface. A substrate W is placed on the plurality of proximity balls 321 to be spaced apart from the upper surface of the heating plate 320 by a predetermined distance (0.1 mm, for example). A plurality (three, for example) of through holes 322 are provided to penetrate the heating plate 320 in an up-and-down direction. An auxiliary plate 340 is arranged on a lower surface of the bottom plate 311 with a seal member Se3 sandwiched therebetween. The seal members Se1, Se2, Se3 are made of O-rings, for example. A plurality of through holes corresponding to the plurality of through holes 322 of the bottom plate 311 are formed in the auxiliary plate 340. A plurality of cylindrical members 341 are attached to the lower surface of the bottom plate 311 to surround the plurality of through holes of the bottom plate 311.

A plurality (three, for example) of support pins 350 are respectively inserted into the plurality of cylindrical members 341, the plurality of through holes of the bottom plate 311 and the plurality of through holes 322 of the heating plate 320. The substrate W is supported on upper ends of the plurality of support pins 350. A seal member Se4 is provided between each support pin 350 and each cylindrical member 341. The seal member Se4 is a metal seal, for example.

A coupling member 351 is arranged below the auxiliary plate 340. The plurality of support pins 350 are attached to the coupling member 351 to extend in the up-and-down direction. The coupling member 351 is connected to a support pin lifting lowering device 352. The support pin lifting lowering device 352 is constituted by an air cylinder, for example. The plurality of support pins 350 are integrally lifted and lowered between upper positions and lower positions by the support pin lifting lowering device 352. The hermetic processing space is formed inside of the chamber 310 by the seal members Se1 to Se4.

One end of a common supply pipe PC is connected to the supply port 314 of the lid 313. One end of a gas supply pipe PG and one end of each of a plurality of solvent supply pipes PS are connected to the other end of the common supply pipe PC. A gas supply valve V1 is inserted into the gas supply pipe PG, and solvent supply valves V2 are respectively inserted into the plurality of solvent supply pipes PS. The other end of the gas supply pipe PG is connected to a gas supply source GS. The other ends of the plurality of solvent supply pipes PS are respectively connected to solvent supply sources SS. The gas supply source GS supplies an inert gas such as a nitrogen gas. The plurality of solvent supply sources SS respectively supply different types of evaporated organic solvents (hereinafter abbreviated as solvents). For example, Toluene, Heptane, Acetone, Propylene Glycol Monomethylether Acetate (PGMEA), Propylene Glycol Monomethylether (PGME), Cyclohexanone, Isopropyl Alcohol (IPA), Carbon disulfide, Tetrahydrofuran or the like is used as the solvent.

When the gas supply valve V1 is opened, an inert gas is supplied into the chamber 310 from the gas supply source GS through the gas supply pipe PG, the common supply pipe PC and the supply port 314. One or a plurality of solvent supply valves V2 are selectively opened, so that evaporated solvents are supplied into the chamber 310 from the solvent supply sources SS corresponding to the solvent supply valves V2 through the solvent supply pipes PS, the common supply pipe PC and the supply port 314 of the lid 313. Thus, one type of a solvent selected from among the plurality of types of solvents or a mixture of a plurality of types of solvents selected from among the plurality of type of solvents is supplied to the substrate W. When the gas supply valve V1 is opened, and one or a plurality of solvent supply valves V2 are opened, an inert gas, and the one selected type of the solvent or the mixture of the plurality of selected types of solvents are mixed and supplied into the chamber 310.

A detection hole 316 is formed in the peripheral wall 312. The detection hole 316 is connected to a solvent concentration sensor 380 through a detection pipe Pd. A detection valve V3 is inserted into the detection pipe Pd. The solvent concentration sensor 380 detects a solvent concentration in the chamber 310.

A plurality of discharge ports 318 are provided along an outer peripheral surface in a lower portion of the peripheral wall 312. The discharge ports 318 are connected to an external discharger EX through discharge pipes Pe1, Pe2. A discharge valve V4 and a discharge pump PM are inserted into the discharge pipe Pe2. When the discharge pump PM is operated and the discharge valve V4 is opened, an atmosphere in the chamber 310 is led to the external discharger EX through the discharge pipes Pe1, Pe2. Thus, the pressure in the chamber 310 is reduced.

The thermal processing device 300 includes a thermal processing controller 390. The thermal processing controller 390 includes a CPU (Central Processing Unit), a ROM (Read Only Memory), a RAM (Random Access Memory) and the like. A control program is stored in the ROM. The CPU controls an operation of each part of the thermal processing device 300 by executing the control program stored in the ROM using the RAM.

(2) Control System of Thermal Processing Device

Figure 2:
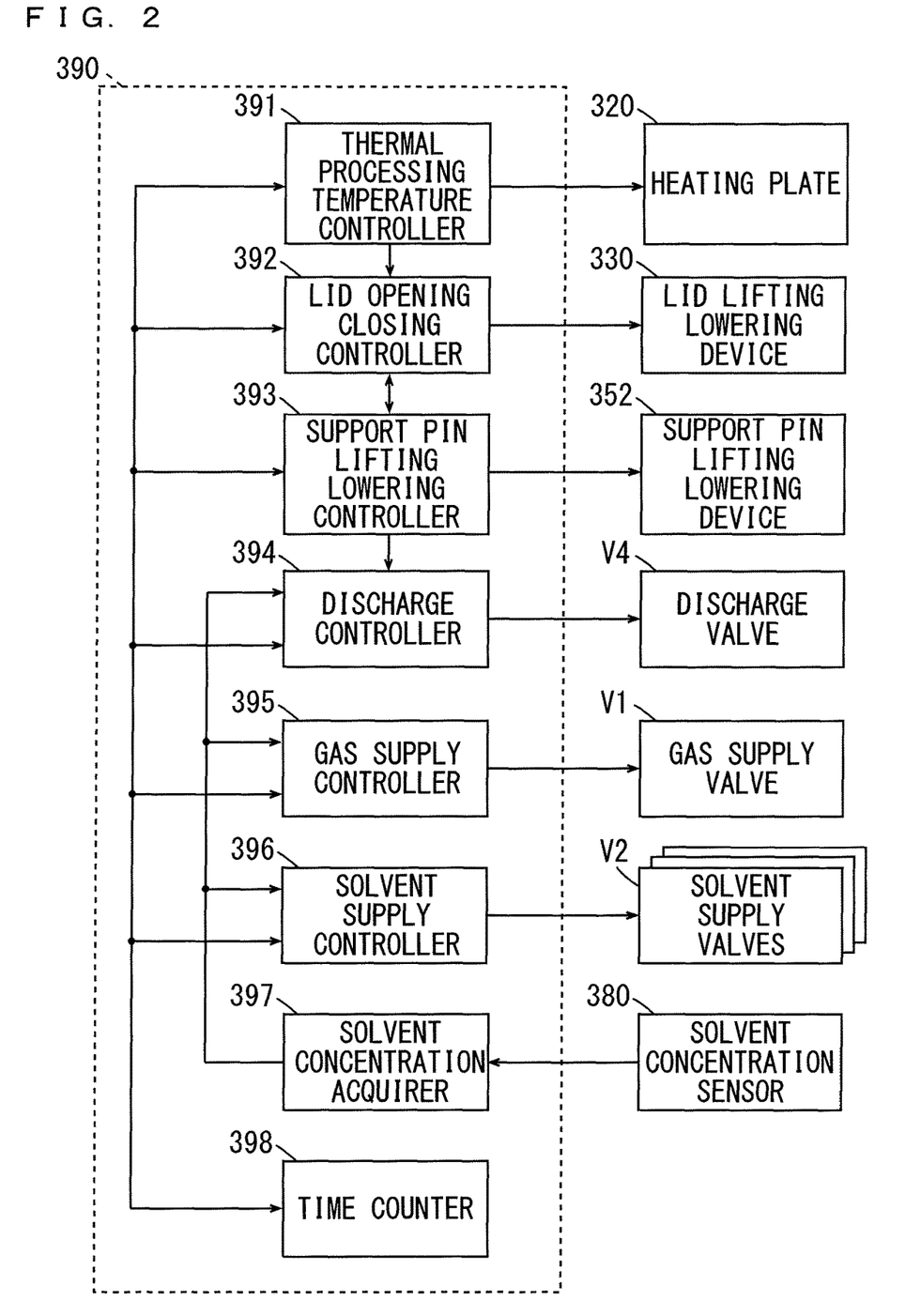
FIG. 2 is a block diagram showing a configuration of a control system of the thermal processing device of FIG. 1.

FIG. 2 is a block diagram showing the configuration of the control system of the thermal processing device 300 of FIG. 1. FIG. 2 shows a functional configuration of the thermal processing controller 390. The thermal processing controller 390 includes a thermal processing temperature controller 391, a lid opening closing controller 392, a support pin lifting lowering controller 393, a discharge controller 394, a gas supply controller 395, a solvent supply controller 396, a solvent concentration acquirer 397 and a time counter 398. The function of each part of the thermal processing controller 390 of FIG. 2 is realized by the execution of the control program by the CPU.

The thermal processing temperature controller 391 controls a temperature of the heating plate 320, the lid opening closing controller 392 controls an operation of the lid lifting lowering device 330, and the support pin lifting lowering controller 393 controls an operation of the support pin lifting lowering device 352. The discharge controller 394 controls opening and closing of the discharge valve V4, the gas supply controller 395 controls opening and closing of the gas supply valve V1, and the solvent supply controller 396 controls opening and closing of the solvent supply valve V2.

The solvent concentration acquirer 397 acquires a solvent concentration from the solvent concentration sensor 380, and supplies the acquired solvent concentration to the discharge controller 394, the gas supply controller 395 and the solvent supply controller 396. The time counter 398 counts an elapsed time period. A time point at which each of the controllers 391 to 396 operates is determined based on an elapsed time period counted by the time counter 398.

(3) One Example of Substrate Processing Method

FIGS. 3A to 3E are schematic cross sectional views showing one example of the substrate processing method using the thermal processing device 300 of FIG. 1. The steps of FIGS. 3C and 3D of the steps of FIGS. 3A to 3E are performed by the thermal processing device 300 of FIG. 1. In the present example, a method of forming a fine hole pattern is shown.

Figure 3A:
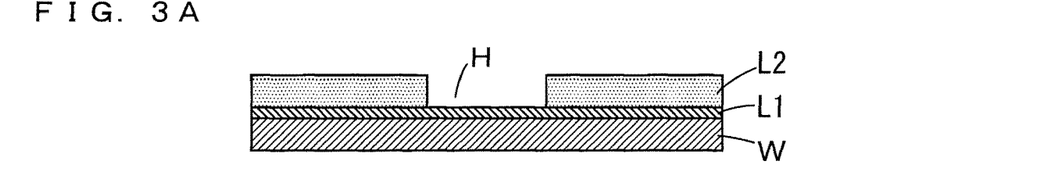
FIGS. 3A to 3E are schematic cross sectional views showing one example of a substrate processing method using the thermal processing device of FIG. 1.
Figure 3B:
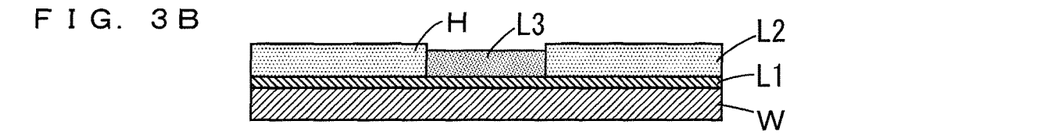

First, as shown in FIG. 3A, an underlayer L1 is formed to cover an upper surface of the substrate W, and a guide pattern L2 made of a photoresist, for example, is formed on the underlayer L1. In the present example, the guide pattern L2 has a circular hole H. Next, as shown in FIG. 3B, a DSA film L3 is formed of a DSA (Directed Self Assembly) material in a region on the underlayer L1 in the hole H of the guide pattern L2. The DSA material is a block copolymer constituted by a plurality of types of polymers. The plurality of types of polymers that constitute the block copolymer is preferably immiscible with each other.

In the present embodiment, the DSA material constituted by two types of polymers is used. Combinations of the two types of the polymers include Polystyrene-Polymethyl Methacrylate (PS-PMMA), Polystyrene-Polydimethylsiloxane (PS-PDMS), Polyethylene-Polyferrocenyl Dimethylsilane (PS-PFS), Polystyrene-Polyethylene Oxide (PS-PEO), Polystyrene-Polyvinyl Pyridine (PS-PVP), Polyethylene-Polyhydroxystyrene (PS-PHOST), Polymethyl Methacrylate-Polymethacrylate Polyhedral Oligomeric Silsesquioxane (PMMA-PMAPOSS) or the like.

Figure 3C:
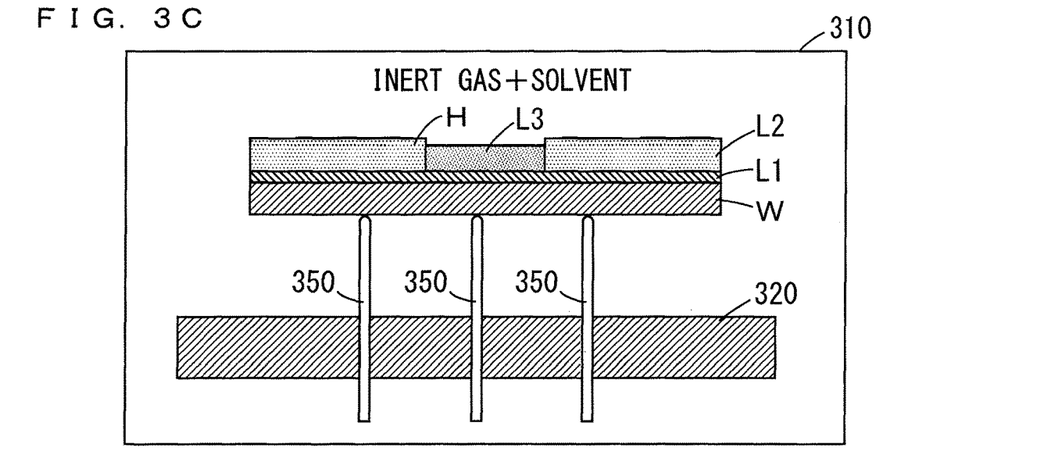

Next, as shown in FIG. 3C, the substrate W is carried into the chamber 310 of the thermal processing device 300 of FIG. 1. The temperature of the upper surface (the heating surface) of the heating plate 320 is set to a thermal processing temperature in advance. The thermal processing temperature is a temperature at which microphase separation of the DSA material occurs. The thermal processing temperature is equal to or higher than 200° C., and is from 250° C. to 300° C., for example. The thermal processing temperature is not limited to the present example, and is determined according to the material of the DSA film such that the microphase separation occurs in the DSA film.

The substrate W is supported on the support pins 350 while being spaced apart upward from the upper surface of the heating plate 320. In this state, an atmosphere (air) in the chamber 310 is replaced with a mixed gas (hereinafter referred to as a solvent containing gas) of a solvent and an inert gas (a nitrogen gas in the present embodiment). Thus, neutralization of the atmosphere, described below, is performed. The concentration of the solvent in the solvent containing gas is from 200 ppm to 800 ppm, for example. The concentration of the solvent is not limited to the present example and determined according to the material of the DSA film. At this time, because the substrate W is spaced apart from the heating plate 320, the temperature of the substrate W is kept at a temperature lower than the temperature at which the microphase separation occurs in the DSA film L3 (the temperature at which the microphase separation does not occur). Therefore, the microphase separation does not occur in the DSA film L3. For example, the temperature of the substrate W is maintained at a temperature lower than 200° C.

An affinity of the solvent for one polymer that constitutes the DSA film L3 and an affinity of the solvent for the other polymer that constitutes the DSA film L3 are substantially equal to each other. Alternatively, one type or a plurality of types of solvents are selected such that affinities for the two types of the polymers that constitute the DSA film L3 are substantially equal to each other. For example, a mixed solvent of Cyclohexanone and PGMEA or a mixed solvent of PGMEA and PGME is used as the solvent. The atmosphere that comes into contact with the DSA film L3 is neutralized by the solvent. Here, the neutralization of the atmosphere means substantial equalization of the affinity of the solvent for one polymer that constitutes the DSA film and the affinity of the solvent for the other polymer that constitutes the DSA film. In this manner, the substrate W is held for a predetermined time period in the solvent containing gas while the temperature of the substrate W is maintained at a temperature lower than the thermal processing temperature (the temperature at which the microphase separation does not occur). While the predetermined time period is from 1 to 5 seconds, for example, the invention is not limited to this. The predetermined time period is set in advance according to the material of the DSA film, a pattern to be formed and the like.

Figure 3D:
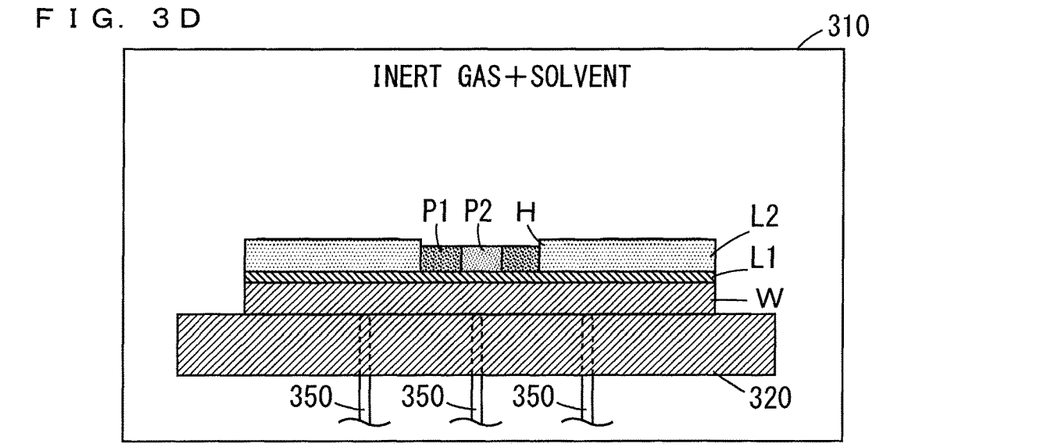

Thereafter, as shown in FIG. 3D, the plurality of support pins 350 are lowered, so that the substrate W is supported on the upper surface (the heating surface) of the heating plate 320 (a position in the proximity of the upper surface of the heating plate 320). Because the temperature of the upper surface of the heating plate 320 is set to the thermal processing temperature in advance, the microphase separation occurs in the DSA film L3 on the substrate W. As a result, a pattern P1 made of the one polymer and a pattern P2 made of the other polymer are formed. In the present example, the annular pattern P1 is formed to extend along an inner peripheral surface of the circular hole H of the guide pattern L2, and the circular pattern P2 is formed inward of the pattern P1. In this case, because the DSA film L3 can be swelled by the solvent, the microphase separation of the DSA material can be promoted.

Figure 3E:
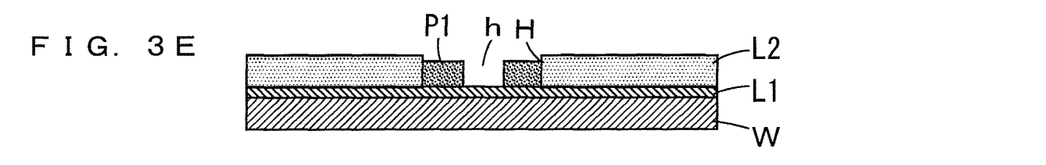

Next, exposure processing is performed on an entire surface of the DSA film L3 in which the microphase separation has occurred. Thus, the coupling between the one polymer and the other polymer is released, and the pattern P1 and the pattern P2 are separated from each other. Next, development processing is performed on the DSA film L3 on the substrate W, whereby the pattern P2 is removed as shown in FIG. 3E. Finally, the pattern P1 (a hole pattern) having a circular hole h remains on the substrate W.

Figure 4A:
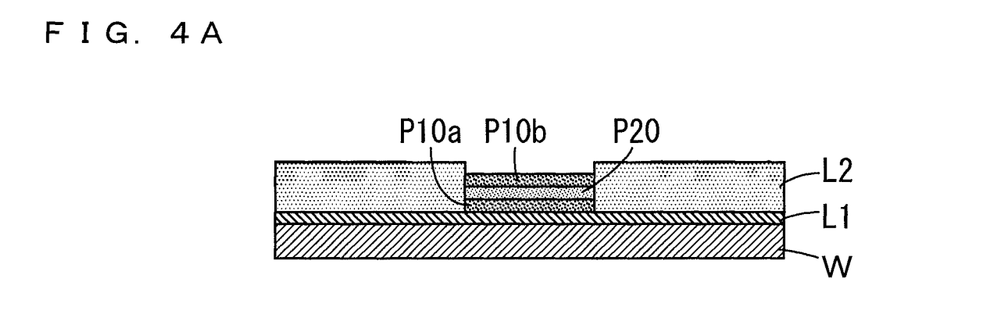
FIGS. 4A to 4C are schematic diagrams for explaining differences in pattern after microphase separation due to presence and absence of neutralization of an atmosphere before thermal processing.
Figure 4B:
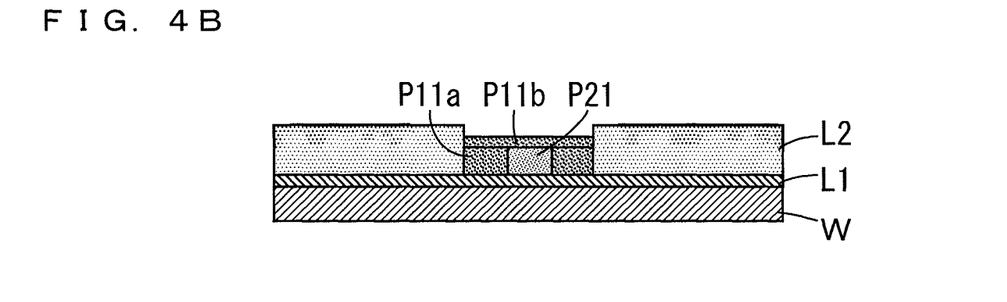
Figure 4C:
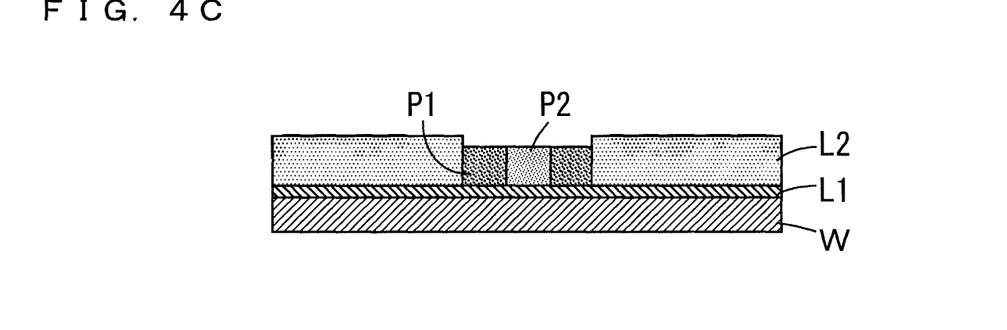

FIGS. 4A to 4C are schematic diagrams for explaining differences in pattern after the microphase separation due to presence and absence of the neutralization of the atmosphere before the thermal processing. FIGS. 4A and 4B show examples of patterns that are formed in the case where the neutralization of the atmosphere is not performed before the thermal processing for the substrate W by the heating plate 320, and FIG. 4C shows an example of patterns that are formed in the case where the neutralization of the atmosphere is performed before the thermal processing for the substrate W by the heating plate 320.

The one polymer that constitutes the DSA film L3 has higher affinity for air than that of the other polymer. Hereinafter, of the two types of the polymers that constitute the DSA film L3, the polymer having higher affinity for air is referred to as a first polymer, and the polymer having lower affinity for air is referred to as a second polymer.

In the case where the neutralization of the atmosphere is not performed before the thermal processing, the microphase separation is likely to be performed such that the first polymer comes into contact with the atmosphere during the thermal processing. In the example of FIG. 4A, a pattern P10a of the first polymer, a pattern P20 of the second polymer and a pattern P10b of the first polymer are formed in the form of layers. In the example of FIG. 4B, an annular pattern P11a of the first polymer is formed, a circular pattern P21 of the second polymer is formed inward of the pattern P11a, and a pattern P11b of the first polymer is formed in the form of a layer to cover the patterns P11a, P21. In these cases, a desired hole pattern cannot be formed by the exposure processing and the development processing.

In contrast, in the case where the neutralization of the atmosphere is performed before the thermal processing, the affinity of the first polymer for the solvent containing gas and the affinity of the second polymer for the solvent containing gas are substantially equal to each other. Thus, as shown in FIG. 4C, the annular pattern P1 of the first polymer is formed, and the circular pattern P2 of the second polymer is formed inward of the pattern P1. A pattern covering the upper surfaces of the patterns P1, P2 is not formed. Therefore, the pattern P2 is removed by the exposure processing and the development processing, whereby the desired hole pattern can be formed.

(4) Operation of Thermal Processing Device 300

Figure 5:
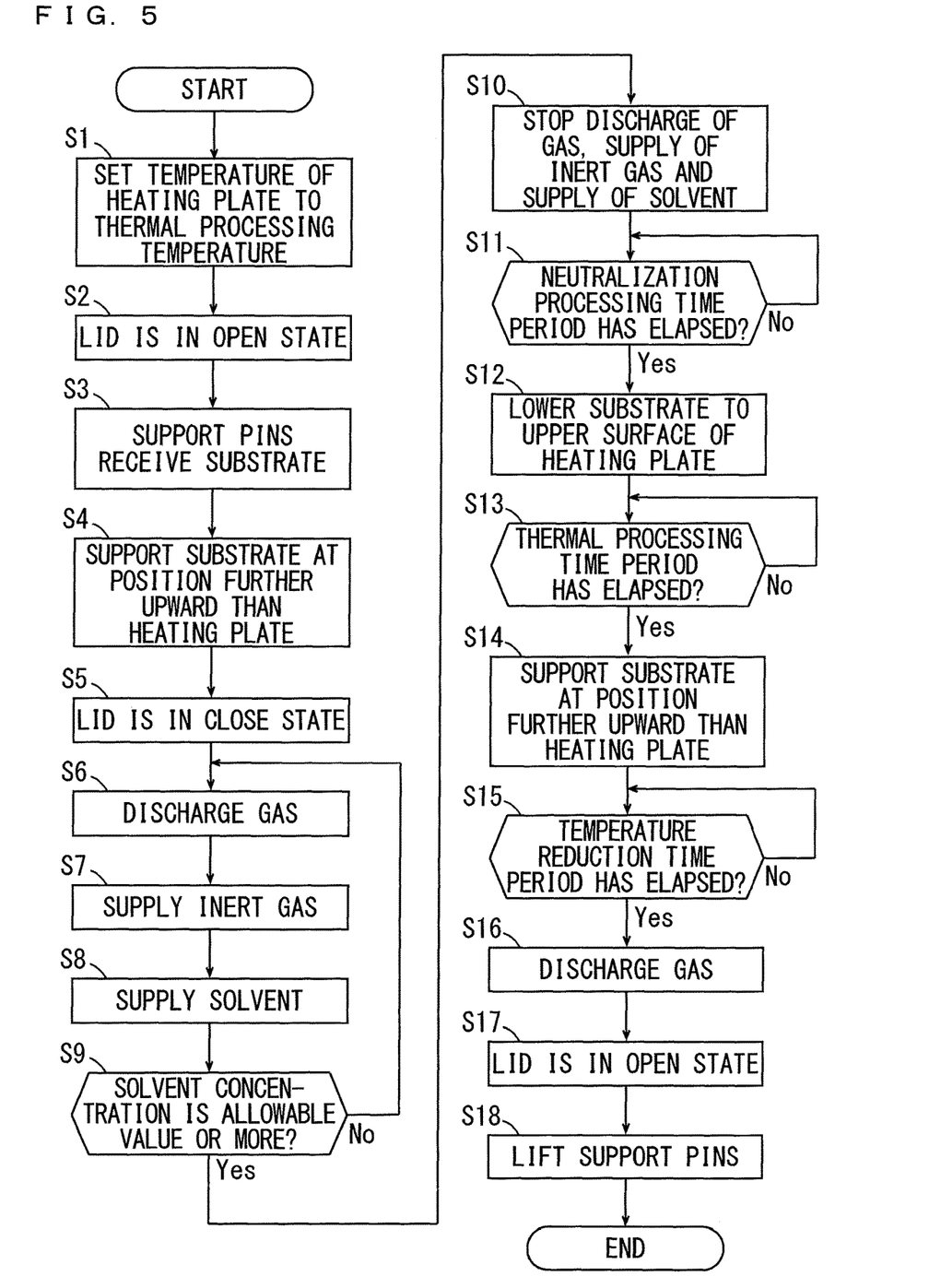
FIG. 5 is a flow chart showing an operation of the thermal processing device of FIG. 1.

FIG. 5 is a flow chart showing the operation of the thermal processing device 300 of FIG. 1. The operation of the thermal processing device 300 of FIG. 1 will be described below with reference to FIGS. 1, 2 and 5.

The thermal processing temperature controller 391 of FIG. 2 sets the temperature of the heating plate 320 to the thermal processing temperature in advance (step S1). Next, the lid opening closing controller 392 controls the lid lifting lowering device 330 such that the lid 313 is in an opened state (step S2). The support pin lifting lowering controller 393 controls the support pin lifting lowering device 352 such that the plurality of support pins 350 are lifted. Thus, the plurality of support pins 350 receive the substrate W (step S3). Thereafter, the support pin lifting lowering controller 393 controls the support pin lifting lowering device 352 such that the plurality of support pins 350 are lowered in the chamber 310. Thus, the plurality of support pins 350 support the substrate W at a position further upward than the heating plate 320 in the chamber 310 (step S4). Thereafter, the lid opening closing controller 392 controls the lid lifting lowering device 330 such that the lid 313 is in a closed state (step S5).

Then, the discharge controller 394 allows air to be discharged from the chamber 310 by opening the discharge valve V4 (step S6). Further, the gas supply controller 395 supplies an inert gas into the chamber 310 by opening the gas supply valve V1 (step S7). Further, the solvent supply controller 396 allows one type or a plurality of types of solvents to be supplied into the chamber 310 by opening one or a plurality of solvent supply valves V2 (step S8). Thus, the air in the chamber 310 is replaced with the solvent containing gas. The performance order of the steps S6, S7, S8 is not limited to the order of FIG. 5, and the steps S6, S7, S8 may be performed in another order or simultaneously performed. While the operation of the discharge pump PM is started in advance in the present example, the discharge pump PM may be operated at a time point of the step S6.

The solvent concentration acquirer 397 acquires a solvent concentration from the solvent concentration sensor 380, and determines whether the acquired solvent concentration is equal to or higher than a preset allowable value (step S9). While the allowable value of the solvent concentration is 100 ppm, for example, the invention is not limited to this. The allowable value of the solvent concentration is set in advance according to the material of the DSA film L3, a pattern to be formed or the like.

The solvent concentration acquirer 397 returns to the step S6 in the case where the solvent concentration is lower than the allowable value. When the solvent concentration is equal to or higher than the allowable value, the discharge controller 394, the gas supply controller 395 and the solvent supply controller 396 allow the discharge valve V4, the gas supply valve V1 and the solvent supply valve V2 to be closed, thereby stopping the discharge of air, the supply of the inert gas, and the supply of the solvent (step S10). Thus, the substrate W is supported in the solvent containing gas while being spaced apart from the heating plate 320. In this case, the temperature of the substrate W is maintained at a temperature at which the microphase separation does not occur in the DSA film.

In this state, the time counter 398 determines whether a preset neutralization processing time period has elapsed (step S11). The substrate W is supported in the solvent containing gas while being spaced apart from the heating plate 320 until the neutralization processing time period elapses. The neutralization processing time period is set in advance according to the material of the DSA film, a pattern to be formed and the like.

When the neutralization processing time period has elapsed, the support pin lifting lowering controller 393 controls the support pin lifting lowering device 352 such that the plurality of support pins 350 are lowered to the lower positions, thereby allowing the substrate W to be lowered to the position in the proximity of the upper surface of the heating plate 320 (step S12). Thus, the temperature of the substrate W is increased to the thermal processing temperature.

Then, the time counter 398 determines whether a preset thermal processing time period has elapsed (step S13). The thermal processing is performed on the substrate W until the thermal processing time period elapses. Thus, the microphase separation occurs in the DSA film.

When the thermal processing time period has elapsed, the support pin lifting lowering controller 393 controls the support pin lifting lowering device 352 such that the plurality of support pins 350 are lifted in the chamber 310. Thus, the plurality of support pins 350 support the substrate W at a position further upward than the heating plate 320 in the chamber 310 (step S14).

In this state, the time counter 398 determines whether a preset temperature reduction time period has elapsed (step S15). The temperature reduction time period is set to a time period required for the temperature of the substrate W to be reduced to a temperature at which the microphase separation does not occur. The substrate W is supported in the solvent containing gas while being spaced apart from the heating plate 320 until the temperature reduction time period elapses. Thus, the temperature of the substrate W is reduced.

When the temperature reduction time period has elapsed, the discharge controller 394 allows the gas to be discharged from the chamber 310 by opening the discharge valve V4 (step S16), and the lid opening closing controller 392 controls the lid lifting lowering device 330 such that the lid 313 is in the opened state (step S17). Thus, the solvent containing gas in the chamber 310 is replaced with air. Thereafter, the support pin lifting lowering controller 393 controls the support pin lifting lowering device 352 such that the plurality of support pins 350 are lifted (step S18). Thus, the substrate W can be carried out from the chamber 310.

(5) Configuration of Substrate Processing Apparatus

Figure 6:
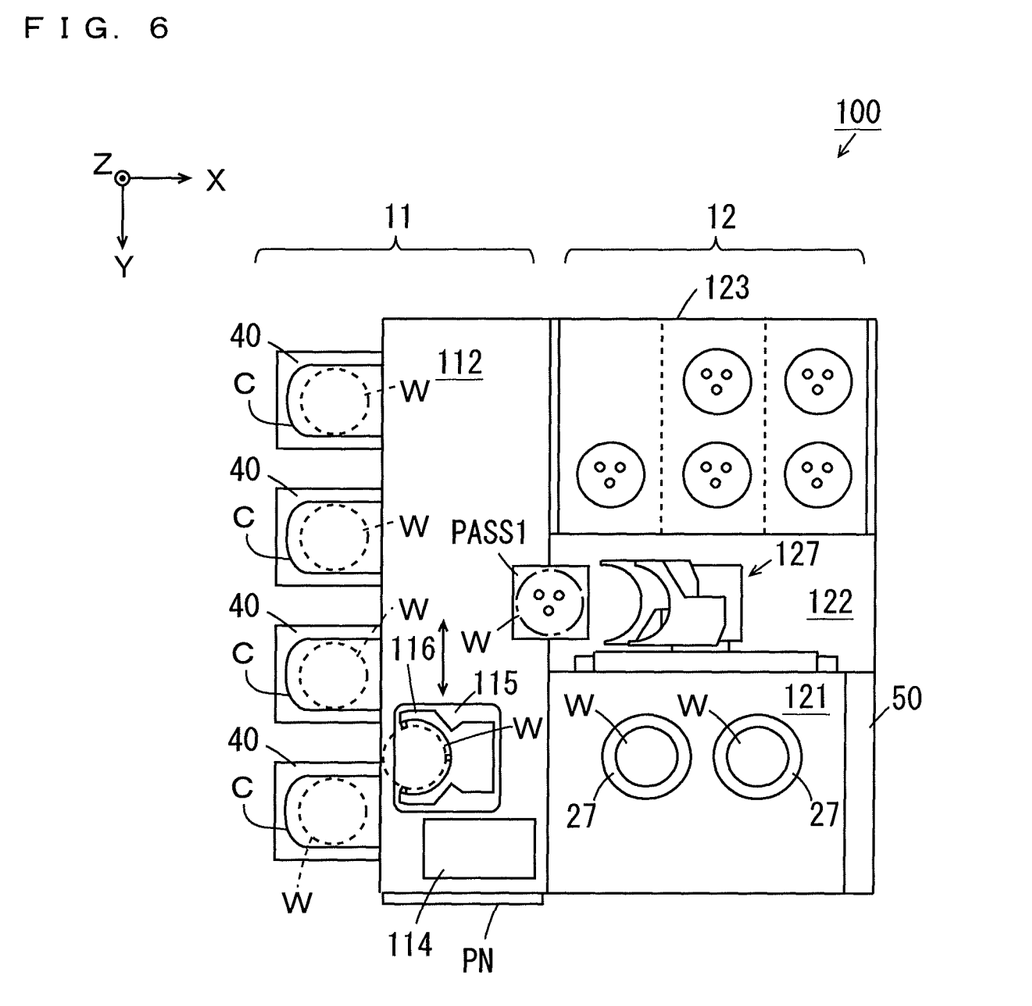
FIG. 6 is a schematic plan view of a substrate processing apparatus including the thermal processing device of FIG. 1.

FIG. 6 is a schematic plan view of the substrate processing apparatus including the thermal processing device 300 of FIG. 1. Each of FIG. 6 and subsequent given drawings is accompanied by arrows indicating an X direction, a Y direction and a Z direction orthogonal to one another for clarity of a positional relationship. The X and Y directions are orthogonal to each other within a horizontal plane and the Z direction corresponds to a vertical direction.

As shown in FIG. 6, the substrate processing apparatus 100 includes an indexer block 11 and a processing block 12. The indexer block 11 includes a plurality of carrier platforms 40 and a transport section 112. A carrier C that stores a plurality of substrates W in a stack is placed on each carrier platform 40.

The transport section 112 is provided with a main controller 114 and a transport mechanism (a transport robot) 115. The main controller 114 controls the constituent elements of the substrate processing apparatus 100. The transport mechanism 115 has a hand 116 for holding the substrate W. The transport mechanism 115 transports the substrate W while holding the substrate W by the hand 116. As shown in the below-mentioned FIG. 9, an opening 117 for reception and transfer of the substrate W between each carrier C and the transport mechanism 115 is formed in the transport section 112.

A main panel PN is provided on a side surface of the transport section 112. A user can confirm the processing status of the substrate W in the substrate processing apparatus 100 and other information on the main panel PN. Further, an operation unit (not shown) composed of a keyboard, for example, is provided near the main panel PN. The user can set operation settings of the substrate processing apparatus 100 and the like by operating the operation unit.

The processing block 12 includes a coating development processing section 121, a transport section 122 and a thermal processing section 123. The coating development processing section 121 and the thermal processing section 123 are provided to be opposite to each other with the transport section 122 interposed therebetween. A substrate platform PASS1 and below-mentioned substrate platforms PASS2 to PASS4 (FIG. 9) on which the substrates W are placed are provided between the transport section 122 and the indexer block 11. A transport mechanism (a transport robot) 127 and a below-mentioned transport mechanism (a transport robot) 128 (FIG. 9) that transport the substrates W are provided in the transport section 122.

Figure 7:
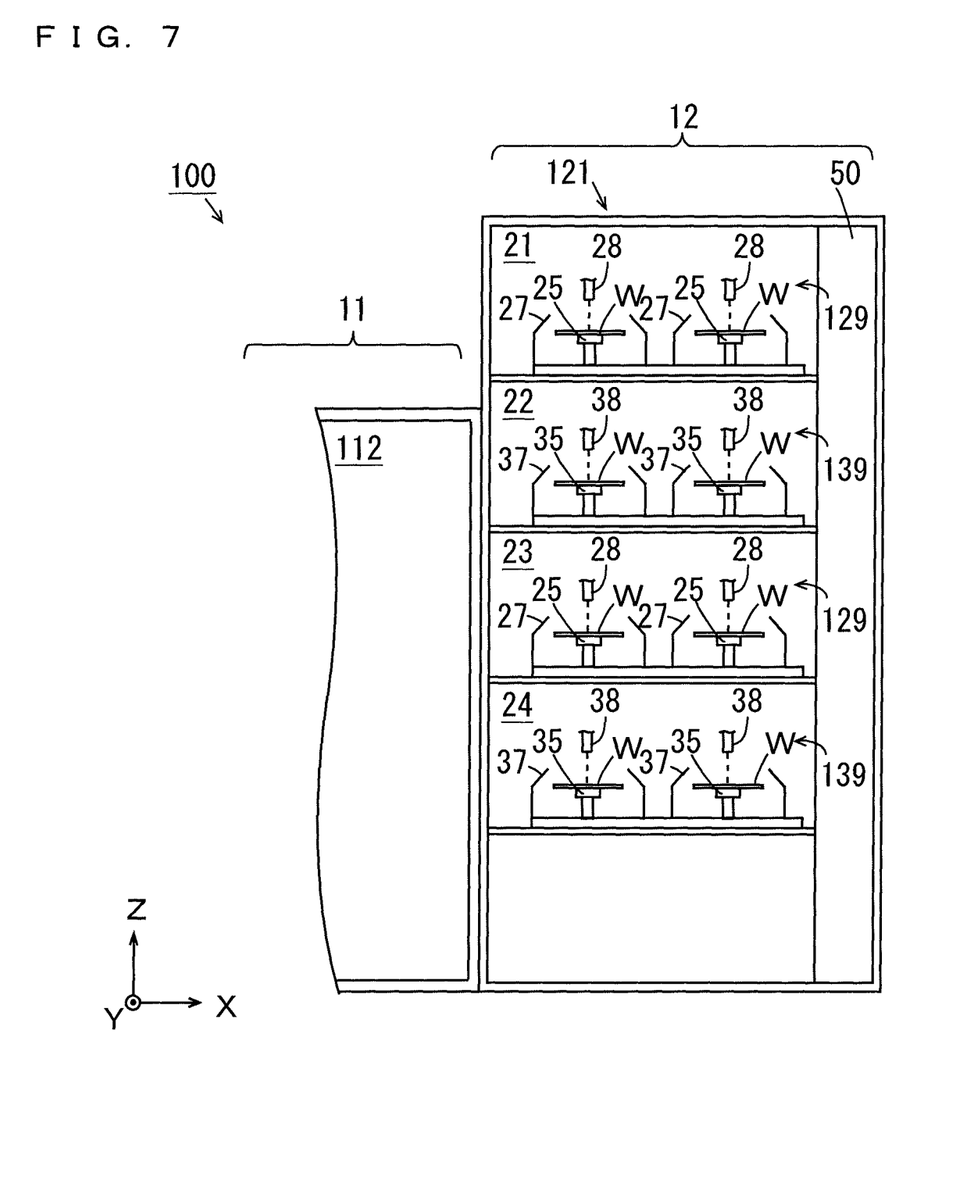
FIG. 7 is a schematic side view of a coating development processing section of FIG. 6.

FIG. 7 is a schematic side view of the coating development processing section 121 of FIG. 6. As shown in FIG. 7, development processing chambers 21, 23 and coating processing chambers 22, 24 are provided in a stack in the coating development processing section 121. Each of the development processing chambers 21, 23 is provided with a development device (a developer) 129. Each of the coating processing chambers 22, 24 is provided with a coating device (a coater) 139.

Each development device 129 includes spin chucks 25 for holding the substrates W and cups 27 provided to cover the surroundings of the spin chucks 25. In the present embodiment, two pairs of the spin chuck 25 and the cup 27 are provided in each development device 129. Each spin chuck 25 is driven to be rotated by a driving device (an electric motor, for example) (not shown). Further, each development device 129 includes a nozzle 28 for supplying a development liquid to the substrate W held by the spin chuck 25. While a plurality of nozzles 28 are provided to respectively correspond to the plurality of spin chucks 25 in the present example, a common nozzle 28 may be used for the plurality of spin chucks 25.

Each coating device 139 includes spin chucks 35 for holding the substrates W and cups 37 provided to cover the surroundings of the spin chucks 35. In the present example, two pairs of the spin chuck 35 and the cup 37 are provided in each coating device 139. Each spin chuck 35 is driven to be rotated by a driving device (an electric motor, for example) (not shown). Further, each coating device 139 includes a nozzle 38 for supplying a processing liquid to the substrate W held by the spin chuck 35. While a plurality of nozzles 38 are provided to respectively correspond to the plurality of spin chucks 35 in the present example, a common nozzle 38 may be used for the plurality of spin chucks 35.

In the coating device 139 in each of the coating processing chambers 22, 24, a processing liquid made of a DSA material is applied to the substrate W. Thus, a DSA film is formed on the substrate W. In the development device 129 in each of the development processing chambers 21, 23, the development processing is performed on the substrate W on which the DSA film is formed. Specifically, the development liquid is supplied to the substrate W on which the DSA film is formed, whereby an unnecessary part of the DSA film is removed. As the development liquid, for example, Toluene, Heptane, Acetone, Propylene Glycol Monomethylether Acetate (PGMEA), Propylene Glycol Monomethylether (PGME), Cyclohexanone, Acetic Acid, Tetrahydrofuran, Isopropyl Alcohol (IPA) or the like is used.

As shown in FIGS. 6 and 7, a fluid box 50 is provided at one end of the coating development processing section 121. The fluid box 50 houses fluid related elements such as pipes, joints, valves, flowmeters, regulators, pumps and temperature adjusters used to supply the processing liquid and the development liquid to the development device 129 and the coating device 139, discharge the liquid and gas from the development device 129 and the coating device 139, and the like.

Figure 8:
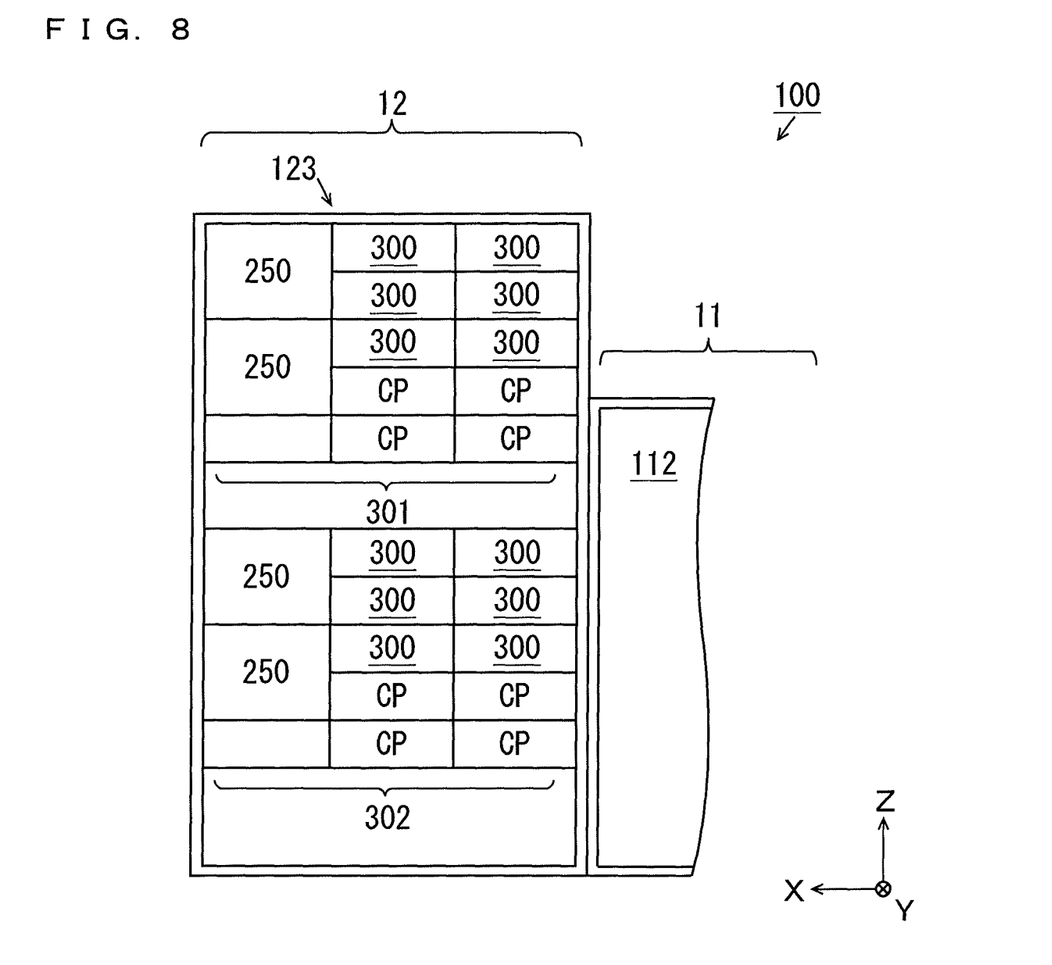
FIG. 8 is a schematic side view of a thermal processing section of FIG. 6.

FIG. 8 is a schematic side view of the thermal processing section 123 of FIG. 6. As shown in FIG. 8, the thermal processing section 123 has an upper thermal processing section 301 provided above and a lower thermal processing section 302 provided below. In each of the upper thermal processing section 301 and the lower thermal processing section 302, a plurality of thermal processing devices 300, a plurality of exposure devices 250 and a plurality of cooling devices (cooling plates) CP are provided.

As described above, in the thermal processing device 300, the neutralization of the atmosphere is performed, and then the thermal processing using the solvent is performed on the substrate W on which the DSA film is formed. In the exposure device 250, the exposure processing is performed on the substrate W on which the solvent thermal processing has been performed. In the cooling device CP, cooling processing is performed on the substrate W on which the DSA film has not been formed and the substrate W on which the thermal processing has been performed.

Figure 9:
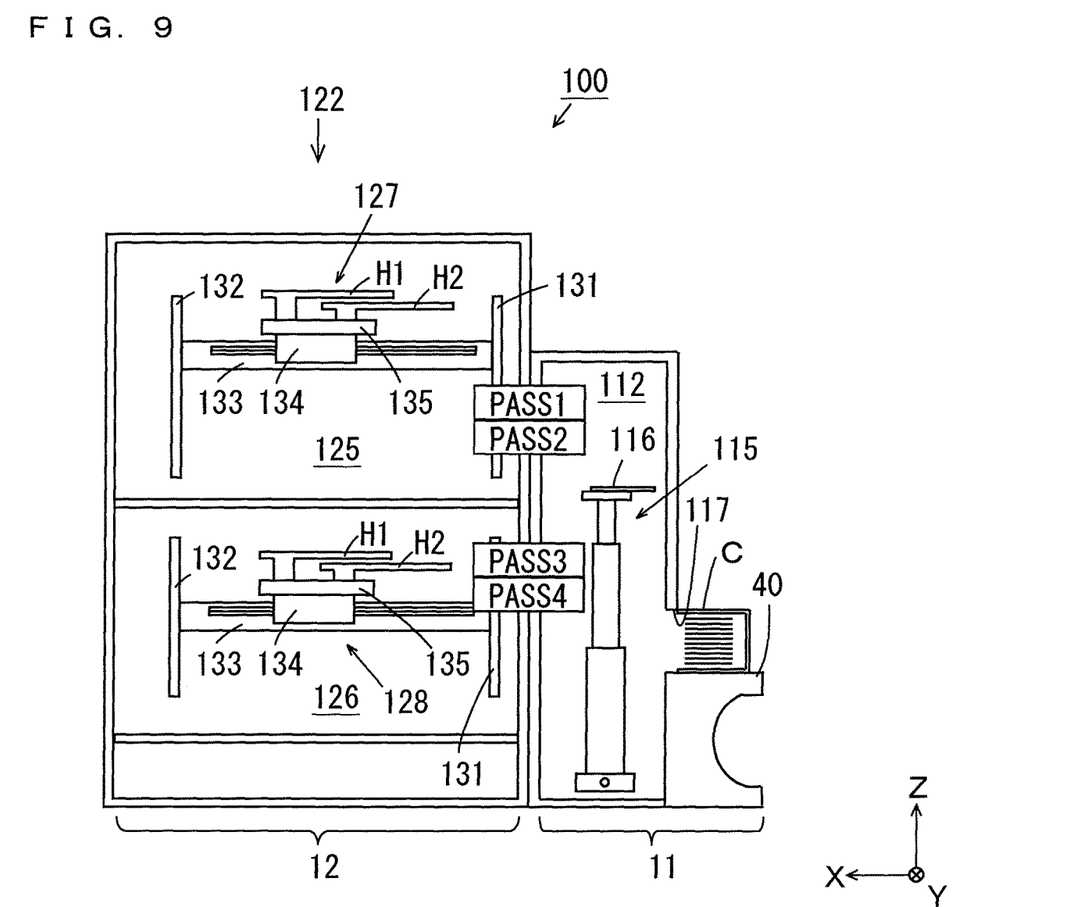
FIG. 9 is a schematic side view of a transport section of FIG. 6.

FIG. 9 is a schematic side view of the transport sections 112, 122. As shown in FIG. 9, the transport section 122 has an upper transport chamber 125 and a lower transport chamber 126. The transport mechanism 127 is provided in the upper transport chamber 125, and the transport mechanism 128 is provided in the lower transport chamber 126.

The substrate platforms PASS1, PASS2 are provided between the transport section 112 and the upper transport chamber 125, and the substrate platforms PASS3, PASS4 are provided between the transport section 112 and the lower transport chamber 126.

The substrate W that is transported from the indexer block 11 to the processing block 12 is placed on either of the substrate platforms PASS1, PASS3. The substrate W that is transported from the processing block 12 to the indexer block 11 is placed on either of the substrate platforms PASS2, PASS4.

Each of the transport mechanisms 127, 128 includes guide rails 131, 132, 133, a moving member 134, a rotating member 135 and hands H1, H2. The guide rails 131, 132 are respectively provided to extend in the up-and-down direction. The guide rail 133 is provided to extend in a horizontal direction (the X direction) between the guide rail 131 and the guide rail 132, and is attached to the guide rails 131, 132 to be movable in the up-and-down direction. The moving member 134 is attached to the guide rail 133 to be movable in the horizontal direction (the X direction).

The rotating member 135 is rotatably provided on an upper surface of the moving member 134. The hand H1 and the hand H2 for holding the substrates W are attached to the rotating member 135. The hands H1, H2 are configured to be capable of advancing and retreating with respect to the rotating member 135.

With such a configuration, each of the transport mechanisms 127, 128 can move in the X and Z directions and transport the substrate W while holding the substrate W using the hands H1, H2. The transport mechanism 127 transports the substrate W among the substrate platforms PASS1, PASS2, the development processing chamber 21 (FIG. 7), the coating processing chamber 22 (FIG. 7) and the upper thermal processing section 301 (FIG. 8). The transport mechanism 128 transports the substrate W among the substrate platforms PASS3, PASS4, the development processing chamber 23 (FIG. 7), the coating processing chamber 24 (FIG. 7) and the lower thermal processing section 302 (FIG. 8).

(6) Operation of Substrate Processing Apparatus 100

The operation of the substrate processing apparatus 100 will be described. First, a carrier C in which the substrates W in an initial state (FIG. 3A) are stored is placed on each carrier platform 40 (FIG. 6) in the indexer block 11. The transport mechanism 115 alternately transports the substrates W in the initial state from any one of the carriers C to the substrate platform PASS1 and the substrate platform PASS3 (FIG. 9).

The substrate W that is placed on the substrate platform PASS1 is taken out by the hand H1 of the transport mechanism 127 (FIG. 9). Next, the transport mechanism 127 (FIG. 9) takes out the substrate W on which the cooling processing has been performed from a predetermined cooling device CP in the upper thermal processing section 301 (FIG. 8) by the hand H2 and carries in the substrate W held by the hand H1 to the cooling device CP. In this case, the temperature of the substrate W is adjusted in the cooling device CP to a temperature suitable for the formation of the DSA film L3.

Next, the transport mechanism 127 (FIG. 9) takes out the substrate W (FIG. 3B) on which the DSA film L3 is formed and which is placed on the spin chuck 35 in the coating processing chamber 22 (FIG. 7) by the hand H1, and places the substrate W on which the cooling processing has been performed and which is held by the hand H2 on the spin chuck 35. In the coating processing chamber 22, the DSA film L3 is formed on the substrate W (FIG. 3B) by the coating device 139 (FIG. 7).

Then, the transport mechanism 127 (FIG. 9) takes out the substrate W (FIG. 3D) on which the thermal processing has been performed from a predetermined thermal processing device 300 in the upper thermal processing section 301 (FIG. 8) by the hand H2, and carries in the substrate W on which the DSA film L3 is formed and which is held by the hand H1 to the thermal processing device 300. The thermal processing for the substrate W is performed in the thermal processing device 300 (FIGS. 3C and 3D).

Next, the transport mechanism 127 (FIG. 9) takes out the substrate W on which the cooling processing has been performed from a predetermined cooling device CP in the upper thermal processing section 301 (FIG. 8) by the hand H1 and carries in the substrate W on which the thermal processing has been performed and which is held by the hand H2 to the cooling device CP. In this case, the temperature of the substrate W is adjusted in the cooling device CP to a temperature suitable for the exposure processing.

Then, the transport mechanism 127 (FIG. 9) takes out the substrate W on which the exposure processing has been performed from a predetermined exposure device 250 in the upper thermal processing section 301 (FIG. 8) by the hand H2, and carries in the substrate W on which the cooling processing has been performed and which is held by the hand H1 to the exposure device 250. In the exposure device 250, the exposure processing is performed on the substrate W on which the thermal processing has been performed.

Next, the transport mechanism 127 (FIG. 9) takes out the substrate W (FIG. 3E) on which the development processing has been performed and which is placed on the spin chuck 25 in the development processing chamber 21 (FIG. 7) by the hand H1 and places the substrate W on which the exposure processing has been performed and which is held by the hand H2 on the spin chuck 35. In the development processing chamber 21, the development processing is performed on the substrate W on which the exposure processing has been performed (FIG. 3E) by the development device 129. Thereafter, the transport mechanism 127 places the substrate W on which the development processing has been performed and which is held by the hand H1 on the substrate platform PASS2 (FIG. 9).

The transport mechanism 127 repeats the above-mentioned processing, whereby the predetermined processing is successively performed on the plurality of substrates W in the processing block 12.

The transport mechanism 128 carries in the substrate W to and carries out the substrate W from the substrate platforms PASS3, PASS4, the development processing chamber 23, the coating processing chamber 24 and the lower thermal processing section 302 by the operation similar to that of the transport mechanism 127. In the development processing chamber 23, the coating processing chamber 24 and the lower thermal processing section 302, the processing similar to the processing performed in the development processing chamber 21, the coating processing chamber 22 and the upper thermal processing section 301 is performed.

In this manner, in the present embodiment, the processing is performed on the substrate W transported by the transport mechanism 127 in the development processing chamber 21, the coating processing chamber 22 and the upper thermal processing section 301, and the processing is performed on the substrate W transported by the transport mechanism 128 in the development processing chamber 23, the coating processing chamber 24 and the lower thermal processing section 302. In this case, the processing for the substrates W can be concurrently performed in the upper processing section (the development processing chamber 21, the coating processing chamber 22 and the upper thermal processing section 301) and the lower processing section (the development processing chamber 23, the coating processing chamber 24 and the lower thermal processing section 302).

(7) Effects

In the substrate processing apparatus 100 according to the present embodiment, the DSA film L3 is formed on the substrate W by the coating device 139. Next, the substrate W is held in the solvent containing gas for a certain time period while being spaced apart from the heating plate 320 in the chamber 310 of the thermal processing device 300. Thus, the neutralization of the atmosphere is performed before the thermal processing in the chamber 310 of the thermal processing device 300. Thereafter, the thermal processing is performed on the DSA film L3 on the substrate W. In this case, because the atmosphere that comes into contact with the DSA film L3 is neutralized before the thermal processing, the microphase separation can appropriately occur. As a result, the fine pattern can be accurately formed on the substrate W.

Further, the substrate W is held at the position further upward than the heating plate 320 during the neutralization of the atmosphere, and the substrate W is held in the proximity of the heating plate 320 during the thermal processing. Thus, it is possible to maintain the temperature of the substrate W at the temperature at which the microphase separation does not occur during the neutralization of the atmosphere without changing the temperature of the heating plate 320 in advance. Therefore, a reduction in throughput does not occur.

Further, because the pressure in the chamber 310 is reduced when the solvent containing gas is supplied into the chamber 310, the air in the chamber 310 can be efficiently replaced with the solvent containing gas. Thus, an occurrence of defects in the pattern formed by the microphase separation is prevented.

Further, the thermal processing is performed on the substrate W, then the substrate W is held at the position further upward than the heating plate 320 until the temperature of the substrate W is lowered, and then the solvent containing gas in the chamber 310 is replaced with air. Thus, the microphase separation does not occur in the DSA film on the substrate W when the solvent containing gas in the chamber 310 is replaced with air. Therefore, an occurrence of defects in the pattern due to the microphase separation in the air is prevented.

(8) Other Embodiments

While the substrate W is spaced apart upward from the upper surface of the heating plate 320 during the neutralization of the atmosphere before the thermal processing in the above-mentioned embodiment, the present invention is not limited to this. The substrate W may be located sideward of the heating plate 320 to be spaced apart from the heating plate 320 during the neutralization of the atmosphere before the thermal processing.

While the substrate processing apparatus 100 includes the exposure device 250 and the development device 129 in the above-mentioned embodiment, at least one of the exposure device 250 and the development device 129 may be provided as an external device of the substrate processing apparatus 100.

(9) Correspondences between Constituent Elements in Claims and Parts in Preferred Embodiments In the following paragraphs, non-limiting examples of correspondences between various elements recited in the claims below and those described above with respect to various preferred embodiments of the present invention are explained.

In the above-mentioned embodiment, the heating plate 320 is an example of a heater, the gas supply pipe PG, the gas supply valve V1, the solvent supply pipe PS and the solvent supply valve V2 are examples of a gas supplier, the support pin 350, the coupling member 351 and the support pin lifting lowering device 352 are examples of a substrate mover, the thermal processing controller 390 and the support pin lifting lowering controller 393 are examples of a movement controller, and the support pin 350 is an example of a supporter. The position further upward than the heating plate 320 is an example of a first position, the position in the proximity of the heating plate 320 is an example of a second position, the discharge pipes Pe1, Pe2, the discharge valve V4 and the discharge pump PM are examples of a discharger or a replacer.

As each of constituent elements recited in the claims, various other elements having configurations or functions described in the claims can be also used.

While preferred embodiments of the present invention have been described above, it is to be understood that variations and modifications will be apparent to those skilled in the art without departing the scope and spirit of the present invention. The scope of the present invention, therefore, is to be determined solely by the following claims.

INDUSTRIAL APPLICABILITY

The present invention can be utilized for processing for various types of substrates.

We claim:

1. A thermal processing device that performs thermal processing on a substrate on which a process film made of a directed self assembly material is formed, comprising:
  a heater that performs the thermal processing on the substrate at a preset thermal processing temperature;
  a chamber that stores the heater, the chamber having an opening for receiving and taking out the substrate and a lid provided to be capable of opening and closing the opening;
  a gas supplier that supplies a solvent containing gas including an organic solvent into the chamber;
  a substrate mover that is configured to move the substrate between a first position at which the thermal processing is not performed on the substrate by the heater and a second position at which the thermal processing is performed on the substrate by the heater in the chamber; and
  a moving controller that is configured to control the substrate mover such that the substrate is held at the first position with the solvent containing gas supplied by the gas supplier present in the chamber, and then controls the substrate mover such that the substrate is held at the second position with the solvent containing gas present in the chamber,
  wherein the first position is set to a position at which microphase separation does not occur in the process film in a case where a temperature of the heater is the thermal processing temperature with the solvent containing gas present, and the second position is set to a position at which the microphase separation occurs in the process film in a case where the temperature of the heater is the thermal processing temperature with the solvent containing gas present.

2. The thermal processing device according to claim 1, wherein the heater includes a heating plate having a heating surface, the first position is a position further upward than the heating surface of the heating plate, and the second position is a position in the proximity of the heating surface such that the thermal processing is performed by the heating plate, and the substrate mover includes a supporter that moves the substrate between the position further upward than the heating surface and the position in the proximity of the heating surface in the chamber while supporting the substrate.

3. The thermal processing device according to claim 1, further comprising a discharger that reduces pressure in the chamber by discharging air from the chamber with the substrate held at the first position by the substrate mover, wherein the gas supplier supplies the solvent containing gas into the chamber in which the pressure is reduced by the discharger.

4. The thermal processing device according to claim 3, further comprising a solvent concentration detector that detects a solvent concentration in the chamber, wherein the discharger and the gas supplier discharges air from the chamber and supplies the solvent containing gas into the chamber such that the solvent concentration detected by the solvent concentration detector is equal to or higher than a preset allowable value.

5. The thermal processing device according to claim 1, wherein the movement controller controls the substrate mover such that, after the thermal processing is performed on the substrate by the heater, the substrate is held at the first position until a temperature of the substrate is reduced to a temperature at which microphase separation of the process film does not occur, and the thermal processing device further includes a replacer that, after the substrate mover holds the substrate on which the thermal processing has been performed, replaces the solvent containing gas with air.

6. The thermal processing device according to claim 1, wherein the solvent containing gas includes an inert gas.

7. A substrate processing apparatus comprising:

a coater that forms a process film on a substrate by applying a directed self assembly material to the substrate; and the thermal processing device according to claim 1 that performs thermal processing on the process film formed on the substrate by the coater.

8. The substrate processing apparatus according to claim 7, further comprising:

an exposer that performs exposure processing on the process film on which the thermal processing has been performed by the thermal processing device; and a developer that performs development processing on the process film on which the exposure processing has been performed by the exposer.

* * * * *